(12) United States Patent
Rahman et al.

(10) Patent No.: US 7,650,528 B2
(45) Date of Patent: Jan. 19, 2010

(54) FUSE FARM REDUNDANCY METHOD AND SYSTEM

(75) Inventors: Mohammad Jahidur Rahman, Richardson, TX (US); Sabuson George, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 304 days.

(21) Appl. No.: 11/759,313

(22) Filed: Jun. 7, 2007

(65) Prior Publication Data

US 2008/0307251 A1 Dec. 11, 2008

(51) Int. Cl.
*G06F 11/00* (2006.01)

(52) U.S. Cl. .......................................... 714/3

(58) Field of Classification Search ................ 714/2–8, 714/15, 16, 18, 25–27, 31, 39, 42, 48, 54
See application file for complete search history.

(56) References Cited

U.S. PATENT DOCUMENTS

| | | | | |
|---|---|---|---|---|
| 6,038,680 A | * | 3/2000 | Olarig | 714/6 |
| 6,041,422 A | * | 3/2000 | Deas | 714/8 |
| 6,154,851 A | | 11/2000 | Sher et al. | |
| 7,053,470 B1 | * | 5/2006 | Sellers et al. | 257/678 |
| 7,152,187 B2 | | 12/2006 | Tran et al. | |
| 7,260,758 B1 | * | 8/2007 | Agrawal et al. | 714/733 |
| 7,328,365 B2 | * | 2/2008 | Karpuszka et al. | 714/6 |
| 7,379,361 B2 | * | 5/2008 | Co et al. | 365/201 |
| 2008/0019198 A1 | * | 1/2008 | Co et al. | 365/201 |
| 2008/0209283 A1 | * | 8/2008 | Gupta et al. | 714/718 |

FOREIGN PATENT DOCUMENTS

| | | |
|---|---|---|
| JP | 2004055100 A | 2/2004 |
| JP | 2005050442 A | 2/2005 |
| JP | 2007035245 A | 2/2007 |
| JP | 2007200527 A | 8/2007 |

* cited by examiner

*Primary Examiner*—Nadeem Iqbal
(74) *Attorney, Agent, or Firm*—Dawn V. Stephens; Wade James Brady, III; Frederick J. Telecky, Jr.

(57) ABSTRACT

A system and method for making efficient use of fuse ROM redundancy to increase yield and security. Some embodiments provide a memory repair system including a non-volatile memory component and a controller coupled to the non-volatile memory component. The non-volatile memory component includes a plurality of memory locations. The plurality of memory locations includes a replacement memory location to replace a faulty memory location and a replacement indicia memory location to store replacement memory location indicia. The controller coupled to the non-volatile memory component reads replacement memory location indicia from the replacement indicia memory location, determines an address for the replacement memory location using the indicia, reads the replacement memory location, and transfers a data value contained in the replacement memory location to a second memory component to repair a defective memory location of the second memory component.

24 Claims, 7 Drawing Sheets

|     | 302 |     |     |     |     | 304 |     |     |     |
| --- | --- | --- | --- | --- | --- | --- | --- | --- | --- |
| RA5 | RA4 | RA3 | RA2 | RA1 | RA0 | WP | RP | R | |
| 1/0 | 1/0 | 1/0 | 1/0 | 1/0 | 1/0 | 0 | 0 | 1 | *FIG. 4A* |

312 310 308

| RA5 | RA4 | RA3 | RA2 | RA1 | RA0 | WP | RP | R | |
| --- | --- | --- | --- | --- | --- | --- | --- | --- | --- |
| X | X | X | X | X | X | 01/10/11 | | 1 | *FIG. 4B* |

| RA5 | RA4 | RA3 | RA2 | RA1 | RA0 | WP | RP | R | |
| --- | --- | --- | --- | --- | --- | --- | --- | --- | --- |
| XX | | XX | | 01/10/11 | | 1 | 1 | 1 | *FIG. 5A* |

| RA5 | RA4 | RA3 | RA2 | RA1 | RA0 | WP | RP | R | |
| --- | --- | --- | --- | --- | --- | --- | --- | --- | --- |
| XX | | 01/10/11 | | 00 | | 1 | 1 | 1 | *FIG. 5B* |

| RA5 | RA4 | RA3 | RA2 | RA1 | RA0 | WP | RP | R | |
| --- | --- | --- | --- | --- | --- | --- | --- | --- | --- |
| 00-11 | | 00 | | 00 | | 1 | 1 | 1 | *FIG. 5C* |

| RA5 | RA4 | RA3 | RA2 | RA1 | RA0 | WP | RP | R | |
| --- | --- | --- | --- | --- | --- | --- | --- | --- | --- |
| XXX | | | 001-111 | | | 1 | 1 | 1 | *FIG. 5D* |

| RA5 | RA4 | RA3 | RA2 | RA1 | RA0 | WP | RP | R | |
| --- | --- | --- | --- | --- | --- | --- | --- | --- | --- |
| 000-111 | | | 000 | | | 1 | 1 | 1 | *FIG. 5E* |

| RA5 | RA4 | RA3 | RA2 | RA1 | RA0 | WP | RP | R | |
| --- | --- | --- | --- | --- | --- | --- | --- | --- | --- |
| 01/10 | | XX | | XX | | 1 | 1 | 1 | *FIG. 6A* |

| RA5 | RA4 | RA3 | RA2 | RA1 | RA0 | WP | RP | R | |
| --- | --- | --- | --- | --- | --- | --- | --- | --- | --- |
| 00/11 | | 01/10 | | XX | | 1 | 1 | 1 | *FIG. 6B* |

| RA5 | RA4 | RA3 | RA2 | RA1 | RA0 | WP | RP | R | |
| --- | --- | --- | --- | --- | --- | --- | --- | --- | --- |
| 00/11 | | 00/11 | | 01/10 | | 1 | 1 | 1 | *FIG. 6C* |

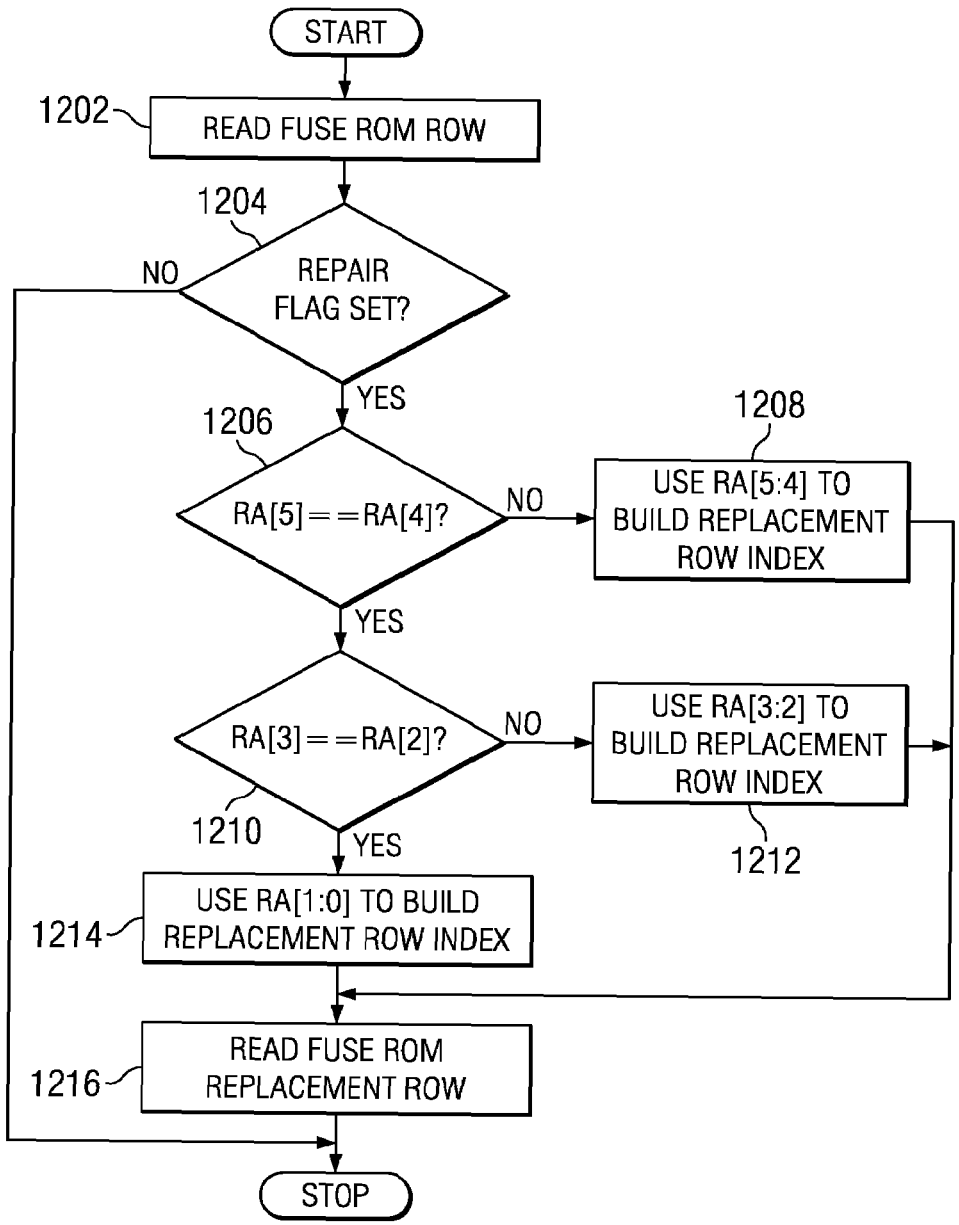

FUSE FARM REDUNDANCY METHOD AND SYSTEM

BACKGROUND

As integrated circuit feature sizes shrink, memories embedded within an integrated circuit increase in density, and become more prone to failure. These failures reduce yield, resulting in higher cost per unit produced. One method of improving embedded memory yield involves including spare memory cells in the integrated circuit to replace memory cells found to be defective when the chip is tested. Employing redundancy in this manner can significantly improve the yield of embedded memories with minimal investment in die area.

"Fuse farms" are utilized as part of a system of embedded memory redundancy. A non-volatile memory in the fuse farm stores all the information necessary to repair embedded memories by replacing faulty memory cells with spare cells. During device initialization, a controller in the fuse farm reads the repair information from the fuse farm non-volatile memory ("fuse ROM") and loads the repair information into the on-chip embedded memories.

Being a form of embedded memory, the fuse ROM is itself subject to an increased rate of failure with reduced feature size. Because the fuse farm supplies repair information for the on chip memories, a fault in the fuse farm memory may result in a die that must be discarded. Moreover, users may be permitted to store limited information, such as serial numbers or part identifiers in fuse ROM after the part leaves the manufacturing facility. The fuse ROM may be implemented in a non-erasable memory technology, making pre-shipment testing of the fuse ROM impossible, and subjecting the manufacturer to an increased risk of loss of customer goodwill if the device is discarded due to an in-field fuse ROM programming failure.

SUMMARY

Accordingly there are herein disclosed various embodiments of systems and methods for making efficient use of fuse ROM redundancy to increase yield and security. In some embodiments, a memory repair system includes a non-volatile memory component and a controller coupled to the non-volatile memory component. The non-volatile memory component includes a plurality of memory locations. The plurality of memory locations includes a replacement memory location to replace a faulty memory location and a replacement indicia memory location to store replacement memory location indicia. The controller reads replacement memory location indicia from the replacement indicia memory location, determines an address for the replacement memory location using the indicia, reads the replacement memory location, and transfers a data value contained in the replacement memory location to a second memory component to repair a defective memory location of the second memory component.

In other embodiments, a method for memory repair includes reading a first memory word, determining whether a second memory word is selected to replace the first memory word, reading a second memory word location, determining a location of the second memory word, reading the second memory word, and transferring a data value from the second memory word to repair a defective memory location In other embodiments, a memory repair system includes a means for non-volatilely storing memory repair information and a means for non-volatilely storing replacement row indexing information. Additionally, the system includes means for accessing the replacement row indexing information, means for determining the location of the memory repair information from the replacement row indexing information, and means for accessing the memory repair information. Means for transferring the memory repair information to a defective memory component to repair the defective memory component is also included.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" and "e.g." are used in an open-ended fashion, and thus should be interpreted to mean "including, but not limited to . . . ". The term "couple" or "couples" is intended to mean either an indirect or direct connection. Thus, if a first component couples to a second component, that connection may be through a direct connection, or through an indirect connection via other components and connections. The term "system" refers to a collection of two or more hardware and/or software components, and may be used to refer to an electronic device or devices, or a subsystem thereof.

BRIEF DESCRIPTION OF THE DRAWINGS

In the following detailed description, reference will be made to the accompanying drawings, in which:

FIGS. 4, 5, and 6 show illustrative applications of repair addressing in a fuse ROM memory word in accordance with the preferred embodiments of the invention;

FIGS. 11 and 12 show flow diagrams for another fuse ROM repair method in accordance with other embodiments of the invention.

The drawings show illustrative embodiments that will be described in detail. However, the description and accompanying drawings are not intended to limit the claimed invention to the illustrative embodiments, but to the contrary, the intention is to disclose and protect all modifications, equivalents, and alternatives falling within the spirit and scope of the appended claims.

DETAILED DESCRIPTION

Disclosed herein are various systems and methods for making efficient use of redundancy to repair faults in fuse farm non-volatile memory, to thereby increase yield. The disclosed embodiments include a system for repairing a fuse ROM that stores fuse ROM repair information in a fuse ROM word, as well as methods for efficient use of fuse ROM redundant resources by storing fuse ROM repair information in a fuse ROM word.

Generally, a memory repair system incorporating fuse farm technology operates to maintain memory functionality by employing spare memory locations within a memory component in place of faulty memory locations within the component. In other words, faulty memory locations are replaced by, or remapped to, functional locations within the memory component. Because the fuse ROM is a critical element of the memory repair system, flexible and efficient means of utilizing redundant fuse ROM resources must be employed to overcome fuse ROM defects.

Figure 1:
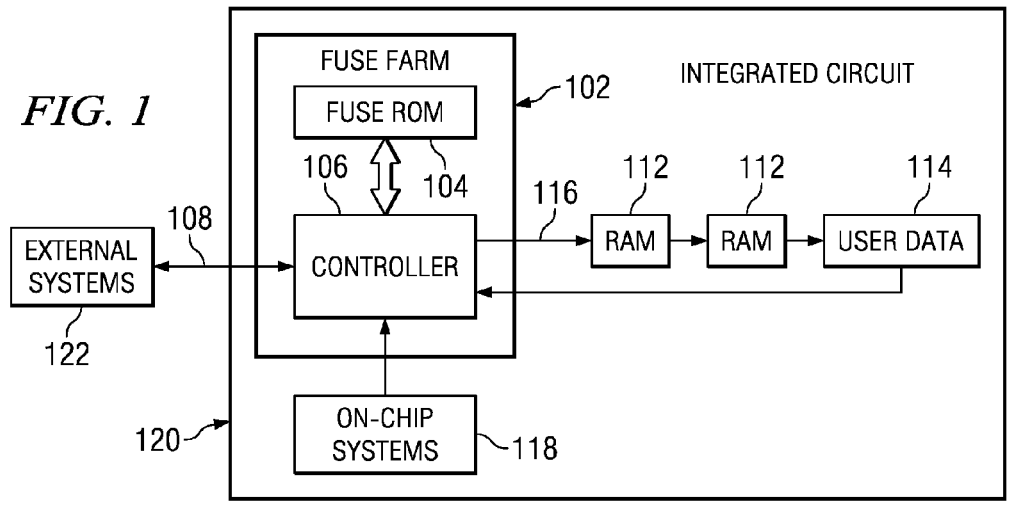
FIG. 1 shows an illustrative integrated circuit which includes a fuse farm coupled to an embedded memory system in accordance with various embodiments of the invention.

FIG. 1 shows an illustrative integrated circuit ("IC") 120 which includes a fuse farm 102 coupled to an embedded memory system 112, 114. Fuse farm 102 comprises a fuse ROM 104 for storage of embedded memory repair information and other user data, and a fuse farm controller 106 for accessing the fuse ROM 104. The fuse ROM 104 is a non-volatile memory that may be implemented in a variety of non-volatile memory technologies, for example, fusible link, anti-fuse, EPROM, EEPROM, FLASH, ferroelectric, magnetic, or equivalent non-volatile memory technologies. The fuse farm controller 106 orchestrates the transfer of memory repair information from the fuse ROM 104 to the embedded memories 112, 114 during device initialization. Controller 106 may be implemented as a state machine, a processor and associated program, or equivalent.

The embedded memories 112, 114 include spare memory cells that may replace memory cells found to be defective when the memories 112, 114 are tested during production. Repair information for enabling spare cells to replace defective cells is written into the fuse ROM 104 as part of the manufacturing process. During device initialization, controller 106 reads repair information from fuse ROM 104 and transfers the repair information to embedded memories 112, 114 via interface 116, which generally comprises a serial scan chain. Note that in the context of the present disclosure, the term "repair" refers not to restoring a defective memory cell to proper operation, but to maintaining operability of the memory as a whole in spite of a defective memory cell through application of redundancy and other techniques.

The controller 106 also manages access to the fuse ROM 104. An interface 108, for example a Joint Test Action Group ("JTAG") interface, allows external systems 122 to access the fuse farm 102. Memory repair information and other user information to be written into the fuse ROM 102 may be transferred via interface 108. On-chip systems 118, for example a processor core, may access the fuse farm 102 through other provided interfaces. Controller 106 operates to enhance device security by disabling read or write access to the programmed fuse ROM 104 by on-chip systems 118 or external systems 122.

Figure 2:
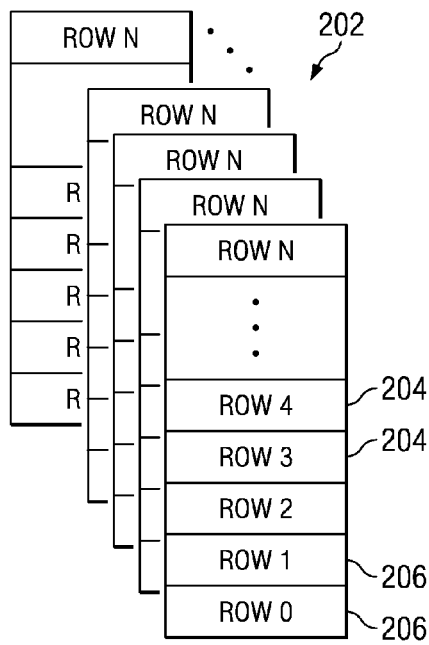
FIG. 2 shows an illustrative array of fuse ROM memory blocks in accordance with the preferred embodiments of the invention.

The reliability of fuse farm 102 is one factor in achieving the yield improvements enabled by including redundant memory cells in embedded memories 112, 114. Existing systems have implemented a variety of reliability enhancement strategies. FIG. 2 shows an illustrative array of fuse ROM memory blocks 202. Each memory block 202 is further subdivided into rows or words 204, 206. One or more of memory rows 206 may be reserved to replace memory rows 204 found to be defective.

Figure 3:
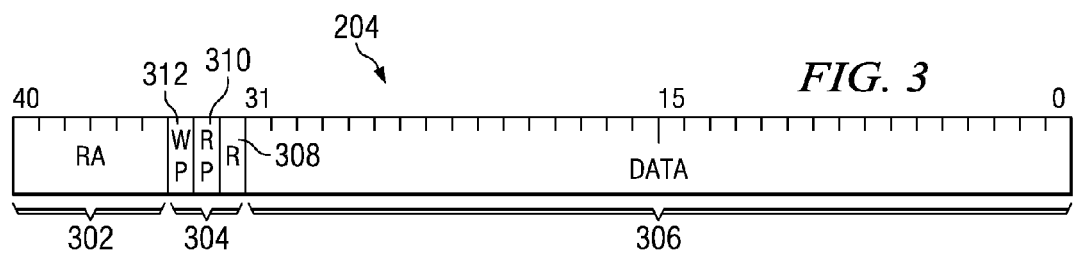
FIG. 3 shows an illustrative fuse ROM memory word in accordance with the preferred embodiments of the invention.

Referring now to FIG. 3, an example of a fuse ROM memory row 204 is illustrated. In the example of FIG. 3, the fuse ROM memory row 204 comprises a data field 306, a repair address ("RA") field 302, and set of access control flags 304. Some embodiments of fuse farm 102 apply the RA field 302 to implement single bit error repairs. When a value is written to data field 306, and subsequent read-back of data field 306 indicates a single defective bit, the column number of the defective bit may be written into the RA field 302. The column number stored in RA field 302 is used to correct the defective bit when the row 204 is subsequently read. When post-write verification of the data field 306 indicates multiple defective bits, or when an attempt to correct a single bit error by writing a column number to the RA field 302 fails, a replacement row 206 may be substituted for the defective row 204. Some fuse farm 102 embodiments set a repair flag 308 to indicate that the row 204 is defective and has been superseded by a replacement row 206. In some fuse farm implementations, selection of a replacement row 206 may be based on the address of the defective row. For example, when two rows of block 202 have been allocated for use as replacement rows 206, the least significant bit ("LSB") of the address of the defective row 204 may serve as an index to the replacement row 206. Similarly, when four rows of block 202 have been allocated for use as replacement rows 206, the two LSBs of the address of the defective row 204 may serve as an index to the replacement row 206. Unfortunately, this indexing method limits row replacement to one of each of a plurality of rows having the same address LSBs. Consequently, notwithstanding the fact that adequate replacement rows are available, when two rows having the same address LSBs are defective, the fuse ROM cannot be repaired, and the device is discarded.

The embodiments of the present disclosure provide for efficient use of fuse ROM replacement rows, thereby reducing the number of unrepairable fuse ROM defects and improving device yield. FIG. 4A shows a first embodiment of an illustrative application of a reserved field, in this example the RA field 302 and control flag field 304, of a defective fuse ROM row 204 to identify a replacement row 206. In FIG. 4A, the repair flag 308 is set indicating substitution of a replacement row 206 for this defective row 204. The write protect ("WP") 312 and the read protect ("RP") 310 flags are reset indicating that the RA field 302 contains a replacement row index. By writing replacement row indexing information into a relatively large field of the defective fuse ROM row 204, such as the RA field 302, a substantial number of replacement rows 206 may be directly accommodated. To enhance data security, the data in defective data field 306 may be obfuscated by overwriting the defective data field 306 with, for example, a random value or all ones.

FIG. 4B illustrates a second aspect of the embodiment of FIG. 4A. In FIG. 4A, the WP 312 and RP 310 flags are "0," which, for purposes of this illustration, is the state of a fuse ROM memory cell prior to programming. The WP 312 and RP 310 flags, so reset, signify that the RA field 302 contains a replacement row index. If a defect in the RA field 302 is identified after writing the replacement row index, and the resultant RA field 302 value is unacceptable for use as a replacement row index, then a two bit non-zero index value may be written to WP 312 and RP 310. The two bit index value written to WP 312 and RP 310 may be used alone or in combination with the defective row address to form a replacement row index. Thus the use of the reserved fields of a defective row support both inter and intra row redundancy.

Figure 7:
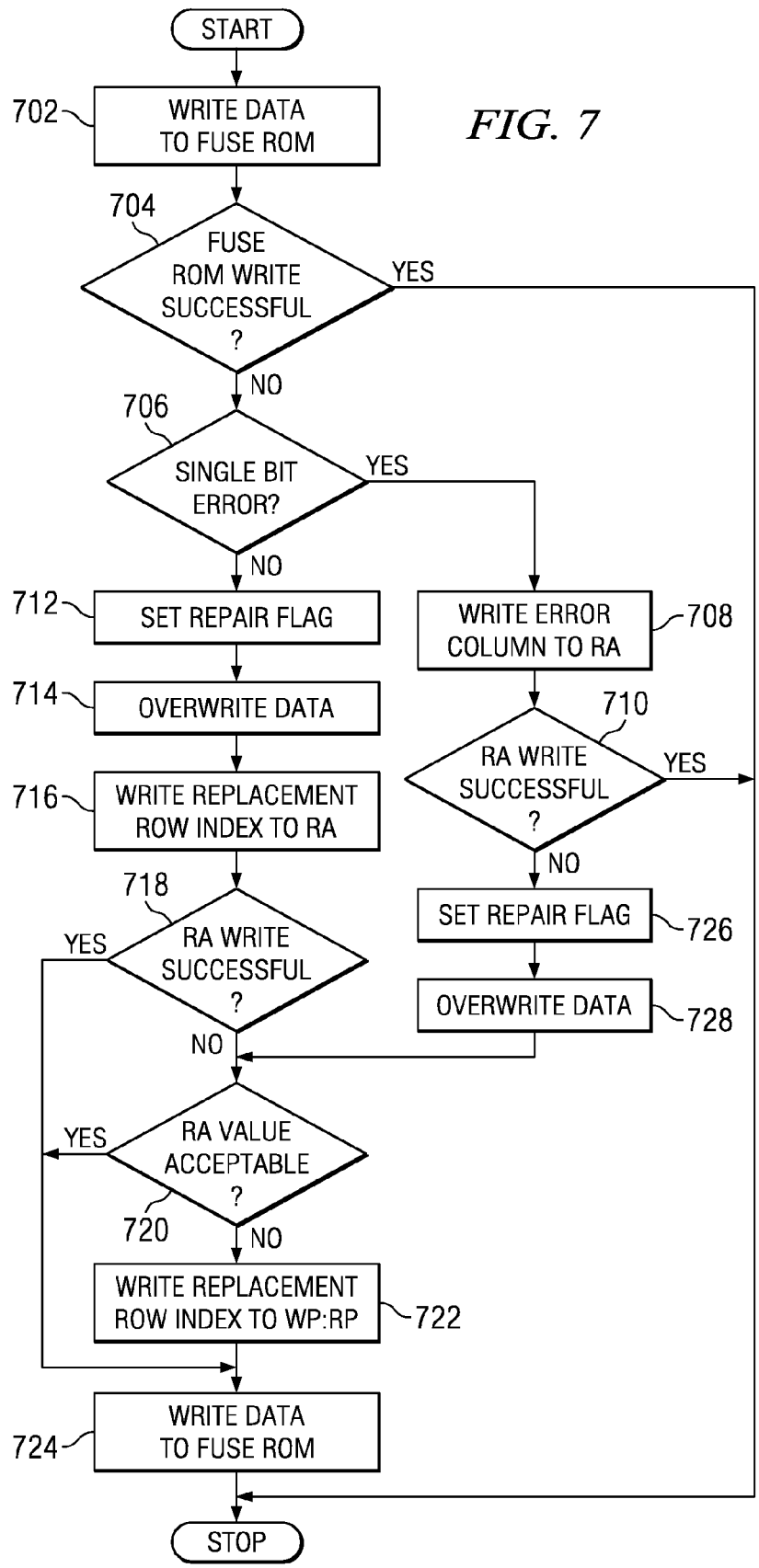
FIGS. 7 and 8 show flow diagrams for a fuse ROM repair method in accordance with the preferred embodiments of the invention.

FIG. 7 shows a flow diagram for an illustrative fuse ROM repair method incorporating storage of replacement row indexing information in a reserved field of the defective row 204. In block 702, a value is written to a data field 306 of a fuse ROM memory row 204. The value is read from the fuse ROM to determine whether the row 204 is defective in block 704. If the write was successful, the operation is complete. If the write failed due to a single bit error in block 706, the column number of the faulty bit is written to the RA field 302 in block 708. The column number write is verified in block 710, and if successful, the write operation is complete. If the column number write is unsuccessful, the repair flag 308 is set in block 726 to indicate replacement of the defective row 204. Data field 306 is overwritten in block 728 to obfuscate any value previously written. When an unsuccessful column number write results in an RA field 302 value acceptable for use as a replacement row index in block 720, the data value is written into the selected fuse ROM replacement row 206 in block 724 and the operation is complete. When an unsuccessful column number write results in an RA field 302 value unsuitable for use as a replacement row index, a two bit non-zero index value is written to the WP 312 and RP 310 fields in block 722, and the data value is written into the selected fuse ROM replacement row 206 in block 724.

If a multi-bit error is detected in block 706, the repair flag 308 is set in block 712. The set repair flag 308 indicates that a replacement row 206 is being substituted for the defective row 204. Data field 306 is overwritten in block 714 to obfuscate any value previously written, and a replacement row index is written to the RA field 302 in block 716. The RA field 302 write is verified in block 718. If the RA field write was successful, the data value is written to the selected fuse ROM replacement row 206 in block 724. If the RA field write was unsuccessful, the acceptability of the RA field value for use as a replacement row index is determined in block 720. For example, if an RA field value resulting from a failed write can nevertheless be used to build a useable replacement row index, the RA field value may be acceptable. If the RA field value is deemed acceptable in block 720, the data value is written to the selected fuse ROM replacement row 206 in block 724. If the RA field value is unacceptable, then a two bit non-zero index value is written to the WP 312 and RP 310 fields in block 722, and the data value is written to the selected replacement row 206 in block 724.

Figure 8:
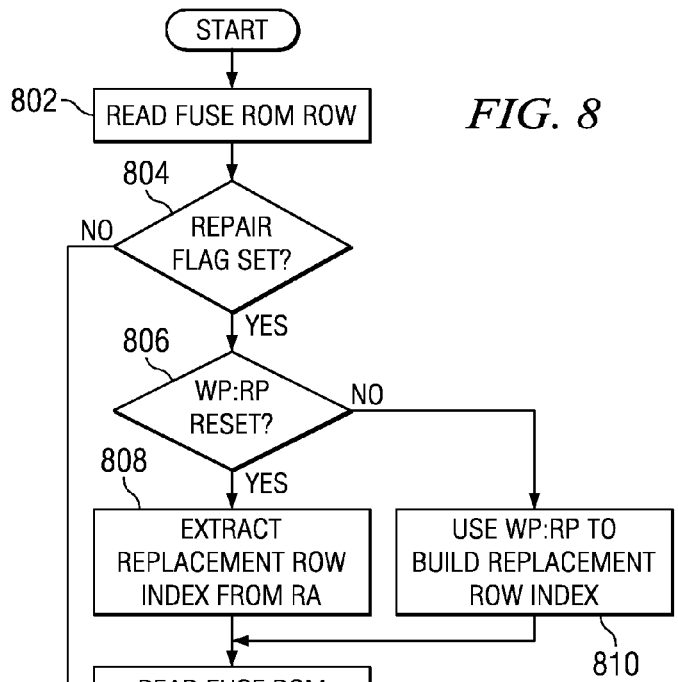

FIG. 8 shows a flow diagram for an illustrative fuse ROM reading method complementary to the replacement row index storage method of FIG. 7. In block 802, the controller 106 reads a fuse ROM row 204. If, in block 804, the repair flag 308 is reset, then the row 204 is deemed free of multi-bit errors, single-bit errors indicated by the RA field 302 are corrected, and the read operation is complete. If the repair flag 308 is set, the row 204 is defective and a replacement row 206 has been substituted. In block 806, if the row's WP 312 and RP 310 flags are reset, the replacement row index is read from the RA field 302 in block 808 and used to read the selected fuse ROM replacement row 206 in block 812. If the WP 312 and RP 310 flags are found to be not reset in block 806, then the two bit index value contained in the WP 312 and RP 310 flags may be used to build a replacement row index in block 810. For example, the two bit index value contained in the WP 312 and RP 310 flags may be combined with the address of the defective row to form a replacement row index. Numerous methods of combining of the index value stored in WP 312 and RP 310 with the defective row address can be used to generate the replacement row index, including using the index value in WP 312 and RP 312 as a complete replacement row index, or using the index value in WP 312 and RP 310 as the LSBs of a replacement row index. The replacement row index built in block 810 is used to read the selected fuse ROM replacement row 206 in block 812.

FIGS. 5A, 5B, and 5C show a first alternative embodiment of an illustrative application of a reserved field, in this example, the RA field 302 and control flag field 304, of a defective fuse ROM row 204 to identify a replacement row 206. In FIG. 5A, the repair flag 308 is set indicating that a replacement row 206 is to be substituted for this defective row 204, and the WP 312 and RP 310 flags are set as a security measure to prevent systems 118, 112 external to the fuse farm 102 from accessing this fuse ROM row 204. In this embodiment access protection redundancy may be provided by disabling both external read and write accesses to the row 204 when either of the WP 312 or RP 310 flags is set.

In FIGS. 5A, 5B, and 5C, the RA field 302 is subdivided into three sets of two bit sub-fields to provide index field redundancy. As exemplified in FIG. 5A, when sub-field RA[1:0] contains a non-zero value, that is, when at least one bit of the sub-field is a "1," the non-zero value denotes an index that may alone or in combination with the address of the defective row be used to identify the replacement row 206. When an index value containing sub-field is identified, higher order RA sub-fields are ignored. Consequently, in FIG. 5A, sub-fields RA[3:2] and RA[5:4] need not be read. In FIG. 5B, the RA[1:0] sub-field is unprogrammed, and therefore zeroed. The zeroed RA[1:0] sub-field indicates that RA[1:0] does not contain an index value, but rather that an index value may be read from one of the higher order RA sub-fields. Sub-field RA[3:2] contains a non-zero index value in FIG. 5B, so sub-field RA[5:4] need not be read. Finally, FIG. 5C illustrates a situation in which both sub-field RA[1:0] and sub-field RA[3:2] are zeroed, indicating that they are unprogrammed and that a two bit index value may be read from sub-field RA[5:4].

Figure 9:
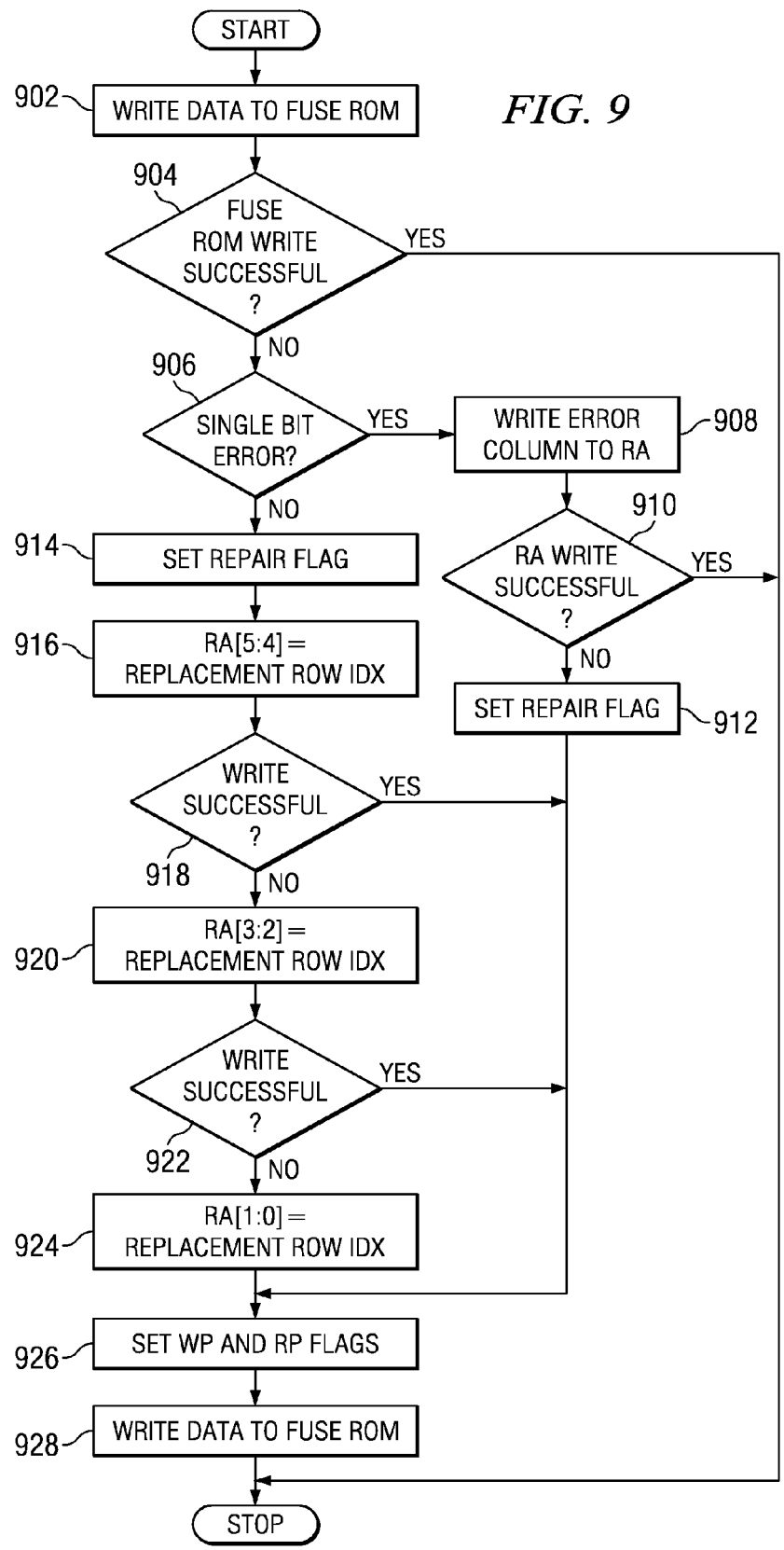

FIG. 9 shows a flow diagram for an illustrative first alternative fuse ROM 104 repair method incorporating storage of a replacement row index in a reserved field of a defective row 204. In block 902, a value is written to the data field 306 of a fuse ROM memory row 204. The value is read from the fuse ROM 104 to determine whether the row 204 is defective in block 904. If the write was successful, the operation is complete. If the write failed due to a single bit error in block 906, the column number of the faulty bit is written to the RA field 302 in block 908. The column number write is verified in block 910, and if successful, the write operation is complete. If, in block 910, the column number write failed, the repair flag 308 is set in block 912 indicating that a replacement row 206 is being substituted for the defective row 204. The RA sub-field values resulting from the failed write of block 908 may be used as an index by the method of FIG. 10. In block 926, the RP 310 and WP 312 flags are set to inhibit access to the defective row by systems 118, 122 external to the fuse farm 102.

If a multi-bit error was detected in block 906, the repair flag 308 is set in block 914. The repair flag 308 indicates that a replacement row 206 is being substituted for the defective row 204. In block 916, an index value which may be used to identify a selected replacement row 206 is written to sub-field RA[5:4]. If, in block 918, the index value write was successful or the resultant sub-field value is acceptable as an index value, the WP 312 and RP 310 flags are set in block 926 to inhibit access to the defective row 204 by systems 118, 112 external to the fuse farm, and the data value is written to the selected fuse ROM replacement row 206 in block 928. If the RA[5:4] sub-field value is unacceptable in block 918, an index value is written to sub-field RA[3:2]. If in block 922, the index value write was successful or the resultant RA[3:2] sub-field value is acceptable as an index value, the WP 312 and RP 310 flags are set in block 926 to inhibit access to the defective row 204 by systems 118, 122 external to the fuse farm 102. The data value is written to the selected fuse ROM replacement row 206 in block 928. If the RA[3:2] sub-field value is unacceptable in block 922, an index value is written into sub-field RA[1:0] in block 924 and the WP 312 and RP 310 flags are set in block 926 to inhibit access to the defective row 204 by systems 118, 122 external to the fuse farm 102. The data value is written to the selected fuse ROM replacement row 206 in block 928.

Figure 10:
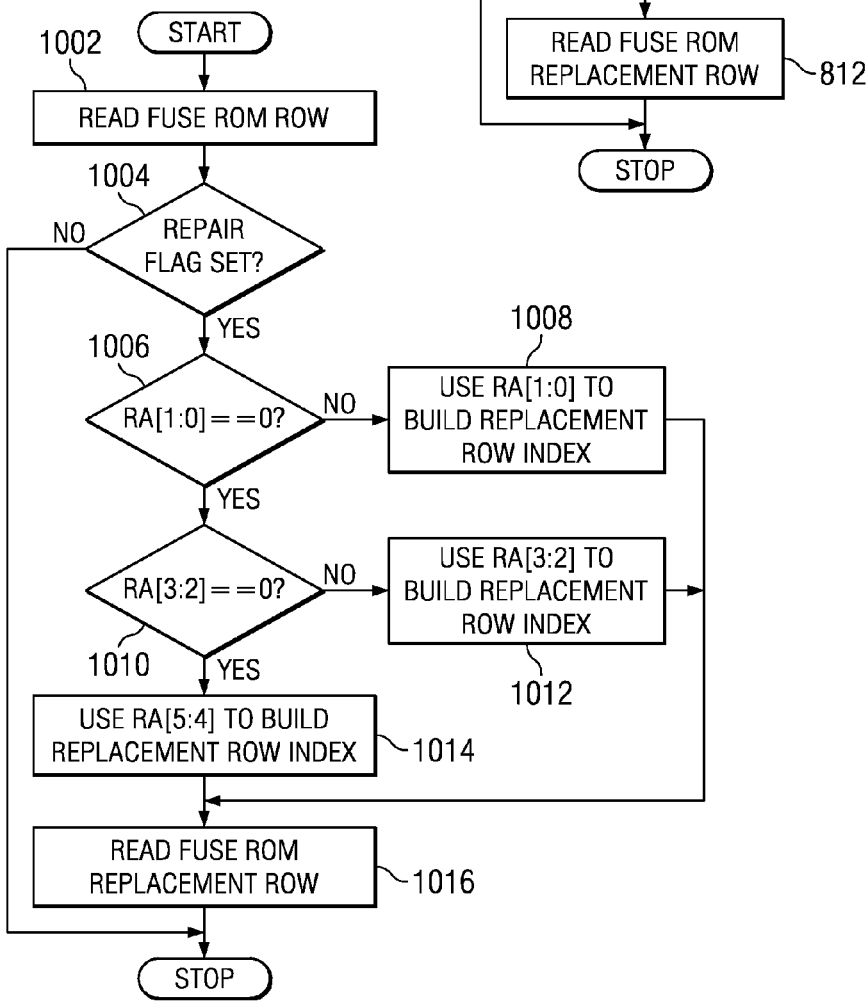
FIGS. 9 and 10 show flow diagrams for a fuse ROM repair method in accordance with other embodiments of the invention.

FIG. 10 shows a flow diagram for an illustrative fuse ROM 104 reading method complementary to the index value storage method of FIG. 9. The method employs successive testing of RA sub-fields to identify a valid index value for location of replacement row 206. In block 1002, the controller 106 reads a fuse ROM row 204. If the repair flag 308 is not set in block 1004, then the row 204 is deemed free of multi-bit errors, single-bit errors indicated by the RA field 302 are corrected, and the read operation is complete. If the repair flag 308 is set in block 1004, the row 204 is defective, and a replacement row 206 has been substituted. In block 1006, if sub-field RA[1:0] is non-zero, then sub-field RA[1:0] contains an index value for identifying a replacement row 206. In block 1008, the contents of sub-field RA[1:0] alone or in combination with the defective row address may be used to build a replacement row index and to read the selected fuse ROM replacement row 206 in block 1016. A replacement row index may be built in block 1008 by, for example, combining the index value extracted from the RA sub-field with the upper bits of the defective row address, such that:

ReplacementRowIndex=(DefectAddress & SubField-Mask)|IndexValue, where DefectAddress is the address of the defective row, SubFieldMask zeros the address field to be replaced by IndexValue, IndexValue is the index value extracted from the RA sub-field, and "&" and "|" denote bit-wise "AND" and "OR" respectively. As in any of the disclosed embodiments, the replacement row index may constitute any value leading to the location of the replacement row 206 including the address of the replacement row 206.

If sub-field RA[1:0] contains all zeros in block 1006, sub-field RA[1:0] does not contain an index value, and sub-field RA[3:2] may be tested for an index value in block 1010. If, in block 1010, sub-field RA[3:2] is found to contain a non-zero value, then sub-field RA[3:2] contains an index value which in block 1012 may be used alone or in combination with the defective row address to build a replacement row index and to read the selected fuse ROM replacement row 206 in block 1016. If sub-field RA[3:2] contains all zeros in block 1010, field RA[5:4] contains an index value, and in block 1014, the contents of sub-field RA[5:4] may be used alone or in combination with the defective row address to build a replacement row index and to read the selected fuse ROM replacement row in block 1016.

FIGS. 5D and 5E show an alternative embodiment of an illustrative application of a reserved field to identify a replacement row 206 wherein the RA field 302 is subdivided into two three bit sub-fields. The present embodiment is similar in many respects to the embodiment of 5A-5C, but employs a three bit rather than a two bit index field. In FIG. 5D, the repair flag 308 is set indicating that a replacement row 206 is to be substituted for the defective row 204. The WP 312 and RP 310 flags are set as a security measure to prevent systems 118, 122 external to the fuse farm 102 from accessing the defective fuse ROM row 204. In this embodiment, access protection redundancy is provided by disabling access to the defective row 204 by systems 118, 122 external to fuse farm 102 when either of the WP 312 or RP 310 flags is set.

The RA field 302 is subdivided into a set of two three bit sub-fields to provide redundant storage for replacement row identifying index values. As illustrated in FIG. 5D, when sub-field RA[2:0] contains a non-zero value, that value denotes an index that may alone or in combination with the address of the defective row 204 be used to identify the replacement row 206. In this embodiment, when an index containing sub-field is identified, higher order RA sub-fields are ignored. Consequently, in FIG. 5D sub-field RA[5:3] need not be read. In FIG. 5E, the RA[2:0] sub-field is unprogrammed, and therefore contains zeros. The zeroed RA[2:0] sub-field indicates that RA[2:0] does not contain an index value, but rather that an index value may be read from the RA[5:3] sub-field.

FIGS. 6A, 6B, and 6C show yet another alternative embodiment of an illustrative application of a reserved field, in this example, the RA field 302 and control flag field 304, of a defective fuse ROM row 204 to identify a replacement row 206. In FIG. 6A, the repair flag 308 is set indicating that a replacement row 206 is to be substituted for this defective row 204. The WP 312 and RP 310 flags are set as a security measure to prevent access to the defective fuse ROM row 204 by systems 118, 122 external to the fuse farm 102. In this embodiment access protection redundancy is provided by disabling access to the defective row 204 by systems 118, 122 external to the fuse farm 102 when either of the WP 312 or RP 310 flags is set.

The RA field 302 is subdivided into a set of three two bit sub-fields to provide index field redundancy. As illustrated in FIG. 6A, when sub-field RA[5:4] contains both a one and a zero, that value denotes an index that may alone or in combination with the address of the defective row be used to identify a replacement row 206. In this embodiment, when an index containing sub-field is identified, lower order RA sub-fields are ignored. Consequently, in FIG. 6A sub-fields RA[3:2] and RA[1:0] need not be read. In FIG. 6B, the RA[5:4] sub-field contains either all ones or all zeros, indicating that the RA[5:4] sub-field does not contain an index value, but rather that an index value may be read from one of the lower order RA sub-fields. Sub-field RA[3:2] contains both a zero and a one, and consequently contains an index value that may alone or in combination with the address of the defective row be used to identify the replacement row 206. In FIG. 6C, both RA[5:4] and RA[3:2] contain either an all ones or all zeros value, indicating that a replacement row identifying index value may be read from a lower order RA sub-field, e.g., sub-field RA[1:0].

Figure 11:
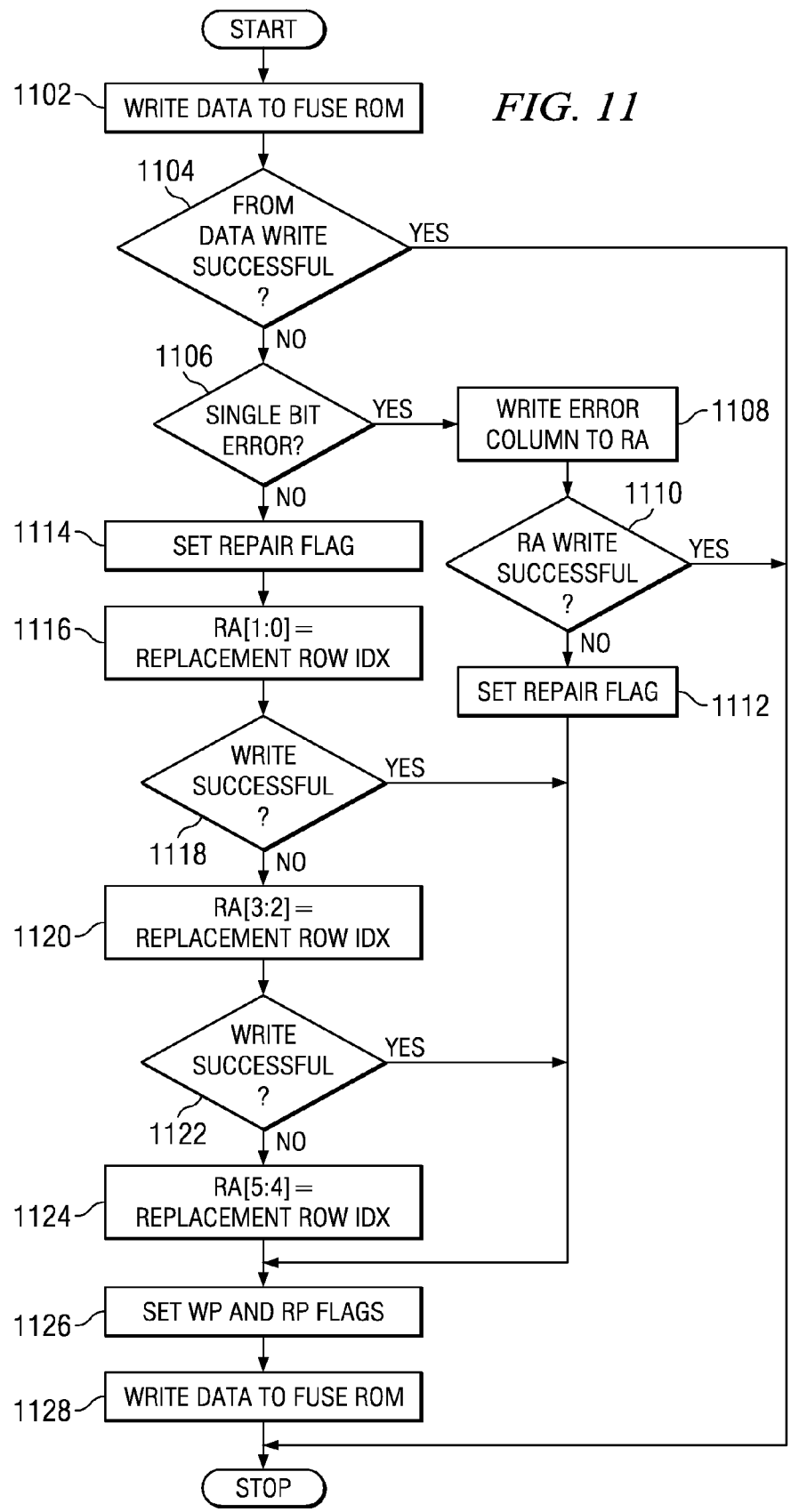

FIG. 11 shows a flow diagram for an illustrative second alternative fuse ROM 104 repair method incorporating storage of a replacement row index in a reserved field of the defective row 204. In block 1102, a value is written to the data field 306 of a fuse ROM memory row 204. The value is read from the fuse ROM 104 to determine whether the row 204 is defective in block 1104. If the write was successful, the operation is complete. If the write failed due to a single bit error in block 1106, the column number of the faulty bit is written to the RA field 302 in block 1108. The column number write is verified in block 1110, and if successful, the write operation is complete. If, in block 1110, the column number write failed, the repair flag 308 is set in block 1112 indicating that a replacement row 206 is being substituted for the defective row 204. The RA sub-field values resulting from the failed write of block 1108 may be used as a replacement row index by the method of FIG. 12. In block 1126, the RP 310 and WP 312 flags are set to prevent access to the defective row 204 by systems 118, 122 external to fuse farm 102, and the data value is written to the selected fuse ROM replacement row 206 in block 1128.

If a multi-bit error is detected in block 1106, the repair flag 308 is set in block 1114. The repair flag 308 indicates that a replacement row 206 is being substituted for the defective row 204. In block 1116, a replacement row identifying index value is written to sub-field RA[1:0]. If, in block 1118, the index value write was successful, the WP 312 and RP 310 flags are set to inhibit systems 118, 122 external to the fuse farm 102 from accessing the defective row 204 in block 1126, and the data value is written to the selected replacement row 206 in block 1128. If, in block 1118, the index value write failed, a replacement row index is written to sub-field RA[3:2] in block 1120. If in block 1122 the index value write was successful, the WP 312 and RP 310 flags are set in block 1126 to inhibit systems 118, 122 external to the fuse farm 102 from accessing the defective row 204. The data value is written to the selected replacement row in block 1128. If the index value write to sub-field RA[3:2] failed in block 1122, an index value is written into sub-field RA[5:4] in block 1124, the WP 312 and RP 310 flags are set in block 1126 to prevent fuse farm external systems 118, 112 from accessing the defective row 204, and the data value is written to the selected replacement row in block 1128.

FIG. 12 shows a flow diagram for an illustrative fuse ROM reading method complementary to the replacement row index storage method of FIG. 11. The method employs successive testing of RA sub-fields to identify a replacement row locating index value. In block 1202, the controller 106 reads a fuse ROM row 204. If the repair flag 308 is not set in block 1204, then the row 204 is deemed free of multi-bit errors, single-bit errors indicated by the RA field 302 are corrected, and the read operation is complete. If the repair flag 308 is set, the row 204 is defective and a replacement row 206 has been substituted. In block 1206, if sub-field RA[5:4] contains both a zero and a one, then sub-field RA[5:4] contains a replacement row identifying index value, and the contents of sub-field RA[5:4] may be used in block 1208 to build a replacement row index, and to read the selected fuse ROM replacement row 206 in block 1216. A replacement row index may be formed in block 1208 by, for example, combining the index value extracted from the RA sub-field with the upper bits of the defective row address, such that:

ReplacementRowIndex=(DefectAddress & SubFieldMask)|IndexValue, where DefectAddress is the address of the defective row, SubFieldMask zeros the address field to be replaced by IndexValue, and IndexValue is the index value extracted from the RA sub-field.

If sub-field RA[5:4] contains all zeros or all ones in block 1206, sub-field RA[5:4] does not contain a replacement row index, and sub-field RA[3:2] is tested for a valid replacement row index value in block 1210. If in block 1210 sub-field RA[3:2] is found to contain neither all ones nor all zeros, then sub-field RA[3:2] contains an index value, and the contents of sub-field RA[3:2] may be used in block 1212 to build a replacement row index, and to read the selected fuse ROM replacement row 206 in block 1216. If field sub-RA[3:2] contains all ones or all zeros in block 1210, then sub-field RA[1:0] contains an index value. In block 1214, the contents of sub-field RA[1:0] are used to build a replacement row index, and to read the selected fuse ROM replacement row 206 in block 1216.

As disclosed, some embodiments apply the RA field 302 to correct single bit memory faults within the data field 306. Control flag field 304 failures are also correctable using the RA field 302. Referring now to FIG. 3 and Table 1 below, where Table 1 contains a set of illustrative RA values for correcting data field 306 and control field 304 bit errors. When a multi-bit data field 306 error or an RA field 302 error necessitates row replacement, repair flag 308 is set. As illustrated in Table 1, various RA field 302 values may be reserved to correct a repair flag 302 memory failure. When a repair flag 308 write fails, an appropriate value may be written to the RA field 302 to accomplish a repair flag 308 correction. When a single data field bit error is detected, and the subsequent RA field column write fails, and the requisite repair flag 308 write also fails, the repair flag 308 failure is correctable by setting the appropriate RA field bits. The resultant RA field 302 value may be used as an index value to build a replacement row index. Thus, this disclosure also supports repair flag 308 redundancy.

TABLE 1

| RA Value | Bit Corrected |
|----------|---------------|
| 000001   | Data 0        |
| 000010   | Data 1        |
| 000011   | Data 2        |
| 011111   | Data 30       |
| 100000   | Data 31       |
| 100010   | RP            |
| 100011   | WP            |
| 11xxxx   | R             |
| 1x1xxx   |               |
| 1xx1xx   |               |

While illustrative embodiments of this invention have been shown and described, modifications thereof can be made by one skilled in the art without departing from the spirit or teaching of this invention. The embodiments described herein are illustrative and are not limiting. Many variations and modifications of the methods and apparatus are possible and are within the scope of the invention. Accordingly, the scope of protection is not limited to the embodiments described herein, but is only limited by the claims which follow, the scope of which shall include all equivalents of the subject matter of the claims.

What is claimed is:

1. A system comprising:
   a non-volatile memory component comprising a plurality of memory locations, wherein the plurality of memory locations comprise a replacement memory location to replace a faulty memory location, and a replacement indicia memory location to store replacement memory location indicia; and
   a controller coupled to the non-volatile memory component that reads the replacement memory location indicia from the replacement indicia memory location, determines an address for the replacement memory location using the indicia, reads the replacement memory location, and transfers a data value from the replacement memory location to a second memory component to repair a defective memory location of the second memory component.

2. The system of claim 1, wherein the non-volatile memory component is not erasable.

3. The system of claim 1, wherein the replacement memory location indicia further comprises a flag indicating that a memory location is defective, and an index value determining the address of the replacement memory location.

4. The system of claim 1, wherein each of the plurality of memory locations further comprises the replacement indicia memory location.

5. The system of claim 1, wherein the controller writes the replacement memory location indicia to the replacement indicia memory location.

6. The system of claim 1, wherein the replacement indicia memory location comprises a plurality of fields, each field containing the replacement memory location indicia.

7. The system of claim 6 wherein, the controller reads the plurality of fields to identify the replacement memory location indicia.

8. The system of claim 1, wherein the plurality of memory locations further comprise a write protect memory location to prevent an external system from writing at least one of the plurality of memory locations, and a read protect memory location to prevent the external system from reading at least one of the plurality of memory locations.

9. The system of claim 8, wherein the controller prevents the external system from accessing at least one of the plurality of memory locations when either of the write memory protect location or the read memory protect location contains a value signifying access prohibition.

10. The system of claim 1, wherein the plurality of memory locations further comprise a single bit error correction memory location for containing indicia of the location of a single defective bit and for correcting a single bit error in the faulty memory location.

11. The system of claim 10, wherein the single bit error correction memory location comprises the replacement indicia memory location and the indicia of the location of a single defective bit comprises the replacement memory location indicia.

12. The system of claim 1, wherein the system comprises an integrated circuit.

13. A method for memory repair comprising:
reading a first memory word;
determining whether a second memory word is selected to replace the first memory word;
reading a second memory word location indicia;
determining a location of the second memory word from the second memory word location indicia;
reading the second memory word;
transferring a repair value from the second memory word to a memory device having a defective memory location to repair the memory device.

14. The method of claim 13, further comprising:
writing a data value to the first memory word;
reading the data value from the first memory word to determine whether the first memory word is defective;
selecting the second memory word to replace the first memory word; and
writing the second memory word location indicia.

15. The method of claim 14, further comprising overwriting the data value written to the first memory word to obfuscate the data value.

16. The method of claim 13, further comprising writing indicia of a single bit error and correcting a single bit error in the first memory word.

17. The method of claim 16, wherein the indicia for correction of a single bit error comprises a column number of a faulty bit in the first memory word.

18. The method of claim 13, further comprising writing indicia of a single bit error wherein indicia of a single bit error comprises the second memory word location indicia.

19. The method of claim 13, wherein the first memory word comprises a plurality of fields, each field dimensioned to store the second memory word location indicia.

20. The method of claim 19, further comprising reading the plurality of fields of the first memory word to identify the second memory word location indicia.

21. The method of claim 20, further comprising writing the second memory word location indicia to at least one of the plurality of fields of the first memory word.

22. A system comprising:
means for non-volatilely storing memory repair information;
means for non-volatilely storing replacement row indexing information;
means for accessing the replacement row indexing information;
means for determining the location of the memory repair information from the replacement row indexing information;
means for accessing the memory repair information;
means for transferring the memory repair information to a defective memory component to repair the defective memory component.

23. The system of claim 22, wherein the means for non-volatilely storing replacement row indexing information stores the replacement row indexing information in a field of a defective memory location of the means for non-volatilely storing memory repair information.

24. The system of claim 22, further comprising means for restricting access to the non-volatile memory repair information storage means and non-volatile replacement row indexing information storage means when an access restriction flag stored in the memory repair storage means is set.

* * * * *